United States Patent
Lee et al.

(10) Patent No.: US 7,446,033 B2
(45) Date of Patent: Nov. 4, 2008

(54) METHOD OF FORMING A METAL INTERCONNECTION OF A SEMICONDUCTOR DEVICE, AND METAL INTERCONNECTION FORMED BY SUCH METHOD

(75) Inventors: Sun-jung Lee, Seoul (KR); Soo-geun Lee, Suwon-si (KR); Hong-jae Shin, Seoul (KR); Andrew-tae Kim, Yongin-si (KR); Seung-man Choi, Hwaseong-si (KR); Bong-seok Suh, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/336,905

(22) Filed: Jan. 23, 2006

(65) Prior Publication Data

US 2006/0177630 A1 Aug. 10, 2006

(30) Foreign Application Priority Data

Jan. 25, 2005 (KR) .................. 10-2005-0006582
Jul. 22, 2005 (KR) .................. 10-2005-0066963

(51) Int. Cl.
*H01L 21/4763* (2006.01)
*H01L 21/44* (2006.01)

(52) U.S. Cl. ............... 438/626; 438/627; 438/631; 438/645; 438/687

(58) Field of Classification Search ........... 438/626, 438/627, 631, 633, 643, 645, 653, 660, 680, 438/687, 691, 692, 677
See application file for complete search history.

(56) References Cited

U.S. PATENT DOCUMENTS 6,790,778 B1 * 9/2004 Cheng et al. ............ 438/687
7,183,199 B2 * 2/2007 Liu et al. ................ 438/633

FOREIGN PATENT DOCUMENTS

JP 11-186261 7/1999
KR 1020020000237 A 1/2002

(Continued)

*Primary Examiner*—Hung Vu
(74) *Attorney, Agent, or Firm*—Volentine & Whitt, PLLC (57) ABSTRACT

A metal interconnection of a semiconductor device, formed using a damascene process, has large grains and yet a smooth surface. First, a barrier layer and a metal layer are sequentially formed in an opening in an interlayer dielectric layer. A CMP process is carried out on the metal layer to form a metal interconnection remaining within the opening. Then, the metal interconnection is treated with plasma. The plasma treatment creates compressive stress in the metal interconnection, which stress produces hillocks at the surface of the metal interconnection. In addition, the plasma treatment process causes grains of the metal to grow, especially when the design rule is small, to thereby decrease the resistivity of the metal interconnection. The hillocks are then removed by a CMP process aimed at polishing the portion of the barrier layer that extends over the upper surface of the interlayer dielectric layer. Finally, a capping insulating layer is formed. The intentional forming of hillocks by the plasma treatment process at weak portions of the metal interconnection and the subsequent removal of the hillocks greatly reduces the possibility of any additional hillocks being produced at the surface of the metal interconnection, especially when the capping layer is formed.

40 Claims, 11 Drawing Sheets

FOREIGN PATENT DOCUMENTS

| | | | |
|---|---|---|---|
| KR | 1020020052833 A | 7/2002 | |
| KR | 1020030096829 A | 12/2003 | |
| KR | 1020040060447 A | 7/2004 | |
| TW | 584921 | 4/2004 | |
| TW | I225684 | 12/2004 | |

* cited by examiner

METHOD OF FORMING A METAL INTERCONNECTION OF A SEMICONDUCTOR DEVICE, AND METAL INTERCONNECTION FORMED BY SUCH METHOD

BACKGROUND OF THE INVENTION

1. Field of the Invention

The present invention relates to a method of manufacturing a metal interconnection of a semiconductor device. More particularly, the present invention relates to a damascene process used to form metal interconnections of a semiconductor device.

2. Description of the Related Art

Copper (Cu) is widely used for forming metal interconnections of highly integrated semiconductor devices. Although the resistivity of aluminum (Al) is about 2.67 $\mu\Omega\cdot$cm, the resistivity of copper is 1.69 $\mu\Omega\cdot$cm. Therefore, the lower resistivity of Cu allows Cu patterns to transmit signals at higher rates than similar Al patterns. In addition, Cu patterns have a great resistance to electromigration (EM), which enhances the reliability of semiconductor devices. Furthermore, Cu is a useful material for forming interconnections because the power consumption of Cu is relatively small and Cu is less expensive as a raw material than Al.

However, it is not easy to etch copper, making it very difficult to pattern a copper layer into a desired shape. Therefore, Cu interconnections are made by forming openings of a desired shape in an interlayer dielectric layer, subsequently forming a layer of Cu over the interlayer dielectric layer to fill the opening with Cu, and removing the unnecessary portion of the copper layer by chemical mechanical polishing (CMP) or the like. This entire process is referred to as a damascene process. In particular, a double damascene process is widely used to form Cu interconnections. This involves forming a via and a trench over the via in an interlayer insulating layer, then forming a Cu layer over the interlayer insulating layer to fill the via and the trench simultaneously, and then planarizing the copper layer.

FIGS. 1A through 1G illustrate a conventional method of forming a copper interconnection by a dual damascene process.

Figure 1A:
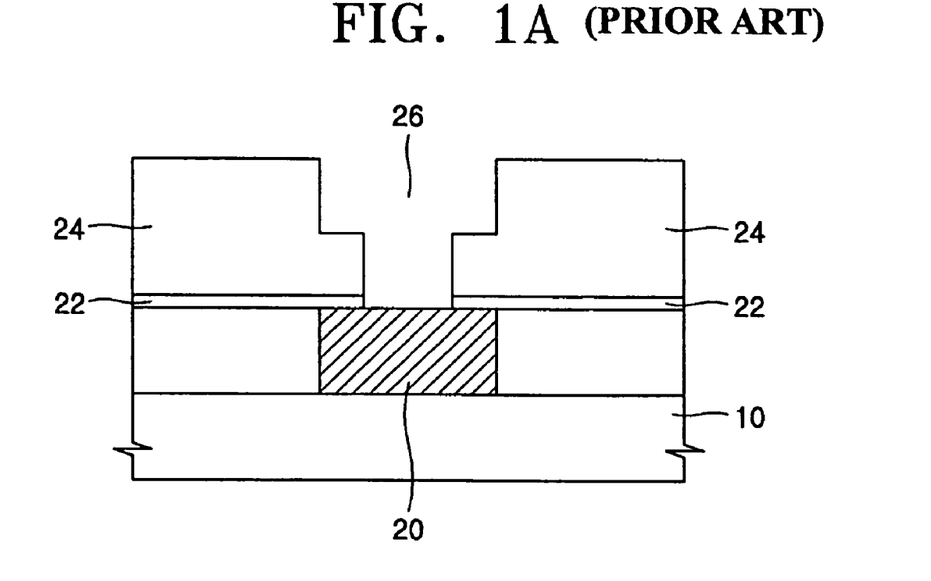
FIGS. 1A through 1G are cross-sectional views of a substrate illustrating a conventional method of forming a metal interconnection.

Referring to FIG. 1A, a semiconductor substrate 10 has a conductive layer 20 formed thereon. An interlayer dielectric layer 24 is formed over the semiconductor substrate 10. The interlayer dielectric layer 24 is etched to form an opening 26 that exposes a conductive element of the conductive layer 20. In this respect, an etch stop layer 22 may be used to prevent the conductive element 20 from being etched when the opening 26 is formed in the interlayer dielectric layer 24.

Figure 1B:
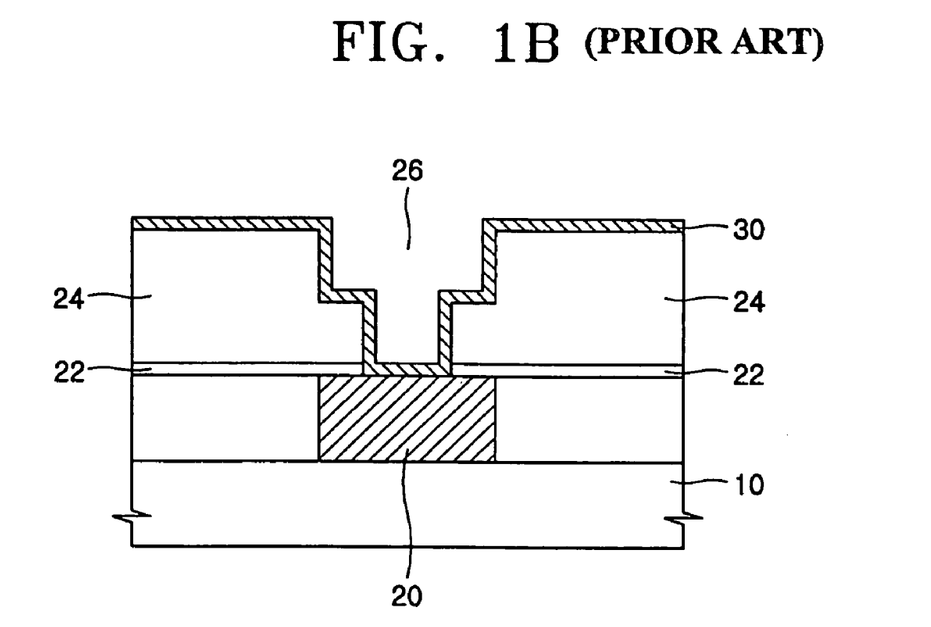

Referring to FIG. 1B, a conductive barrier layer 30 is formed on the inner walls of the interlayer dielectric layer 24 that define the opening 26, and on the upper surface of the interlayer dielectric layer 24.

Figure 1C:
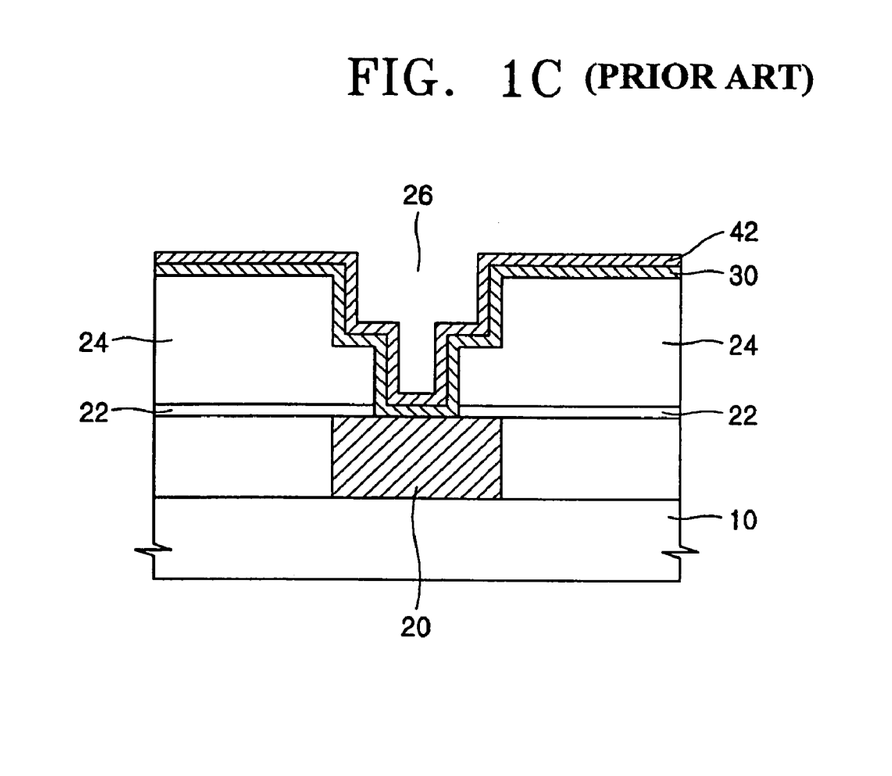

Referring to FIG. 1C, a copper seed layer 42 is formed on the conductive barrier layer 30.

Figure 1D:
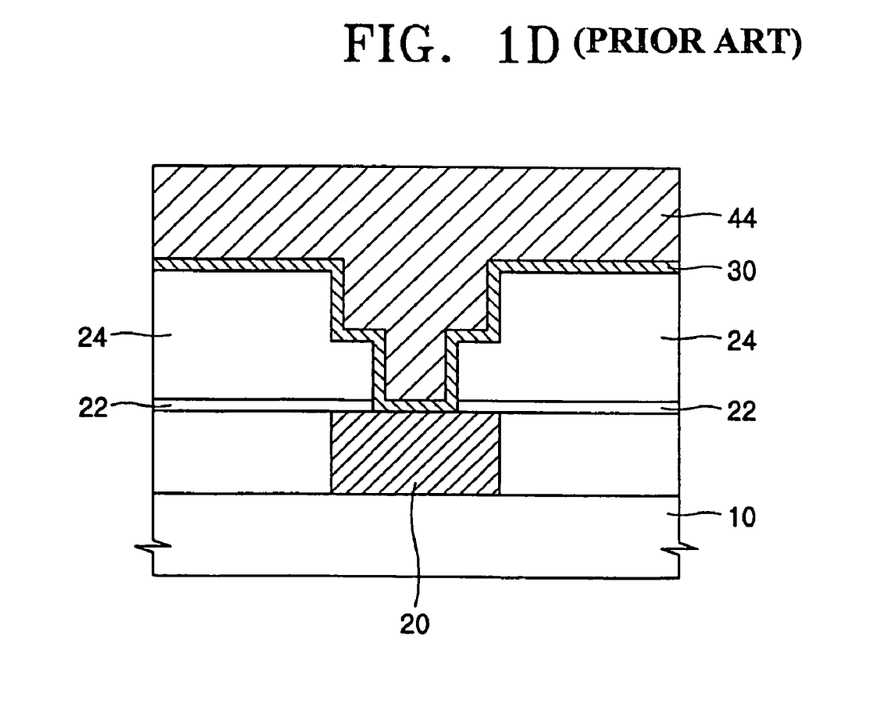

Referring to FIG. 1D, a copper layer 44 is formed by an electroplating process using the copper seed layer 42 to fill the opening 26.

Figure 1E:
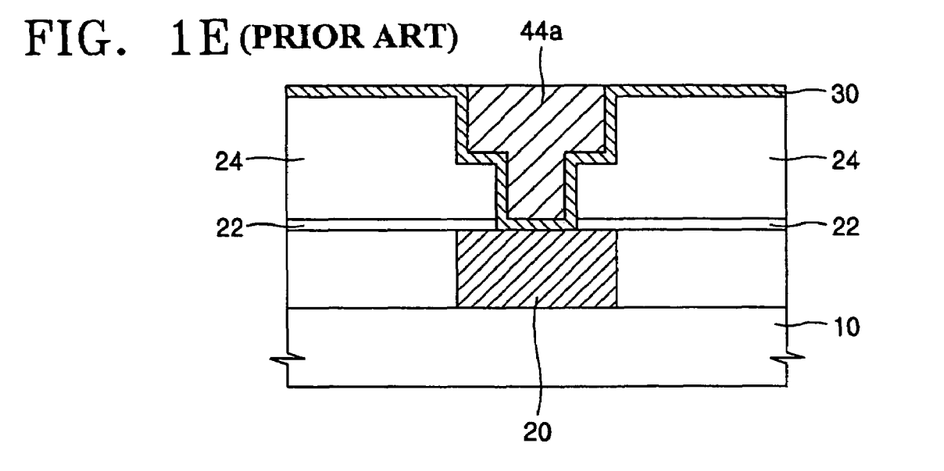

Referring to FIG. 1E, the unnecessary portion of the copper layer 44, i.e. the portion above the interlayer dielectric layer 24 around the opening 26, is removed by CMP so that the copper remains only within the opening 26, to form a copper interconnection 44a.

Figure 1F:
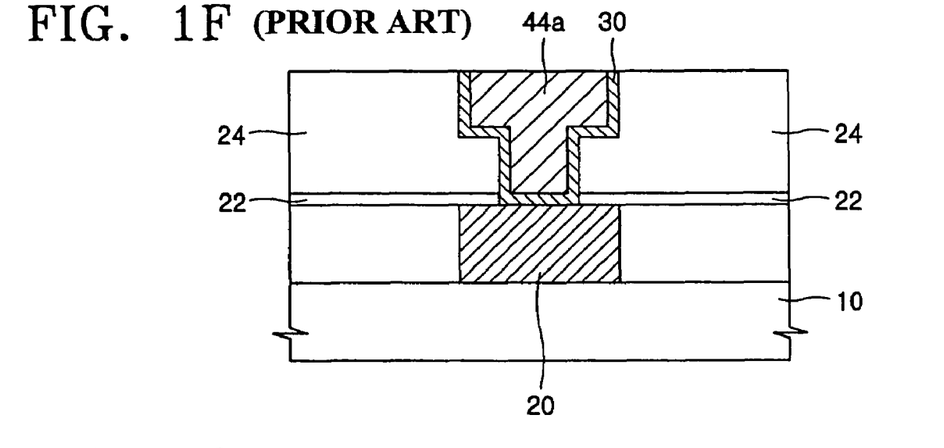

Referring to FIG. 1F, the conductive barrier layer 30 on the upper surface of the interlayer dielectric layer 24 is removed by CMP to expose the upper surface of the interlayer dielectric layer 24.

Figure 1G:
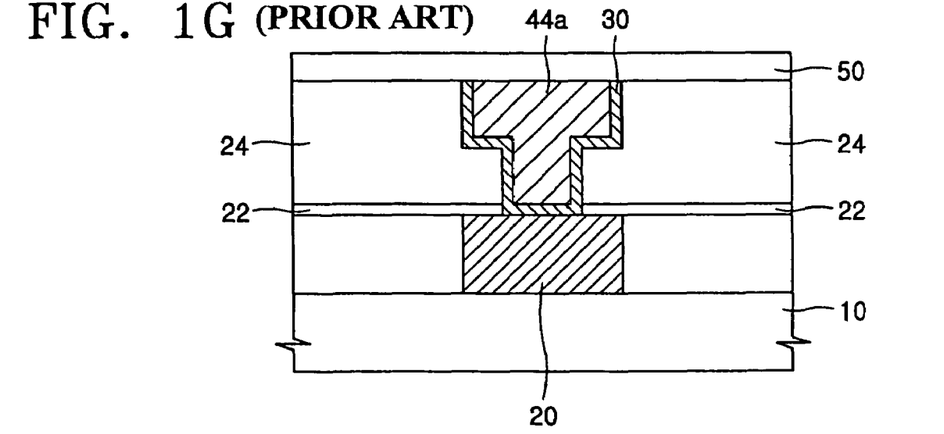

Referring to FIG. 1G, a capping insulating layer 50 is formed on the copper interconnection 44a and the interlayer dielectric layer 24.

In the conventional method of forming a metal interconnection as described above, the process of forming the capping insulating layer 50 (FIG. 1G) is typically carried out at a temperature in the range of 350° C. to 400° C. Furthermore, a plasma treatment process is performed to remove a copper oxide layer from the surface of the copper interconnection after the CMP process and before the capping insulating layer 50 is formed. The high process temperature of the plasma treatment and the actions of radicals formed during the plasma treatment process raise the temperature of the wafer, which induces compressive stress in the copper interconnection 44a due to the difference in the coefficients of thermal expansion (CTE) between the copper interconnection 44a and the semiconductor substrate 10. As a result, portions of the copper interconnection 44a rise up at some grain boundary areas, thereby forming features referred to as hillocks.

Figure 2A:
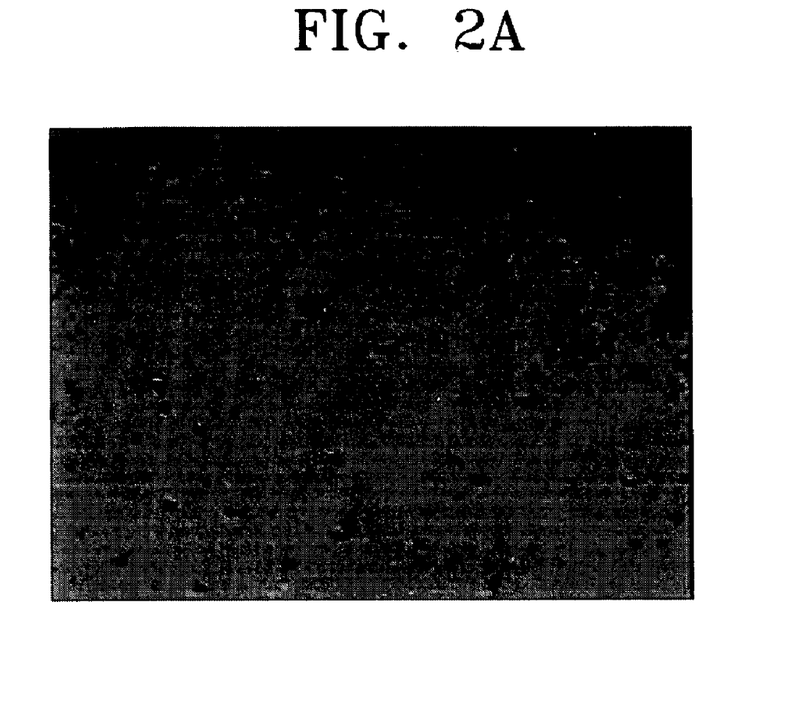
FIG. 2A is a photograph of the surface of a capping insulating layer formed over a copper interconnection, illustrating surface defects caused by copper hillocks when the copper interconnection is formed according to the conventional method.

FIG. 2A is a photograph of the surface of the capping insulating layer showing surface defects caused by the copper hillocks.

Figure 2B:
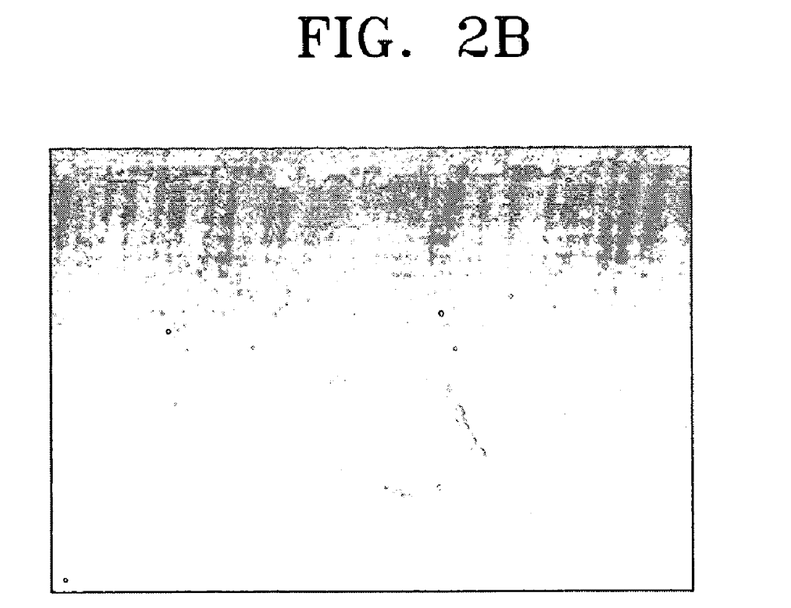
FIG. 2B is a photograph of the copper hillocks when the capping insulating layer is removed.

FIG. 2B is a photograph of the copper hillocks when the capping insulating layer is removed.

Figure 3A:
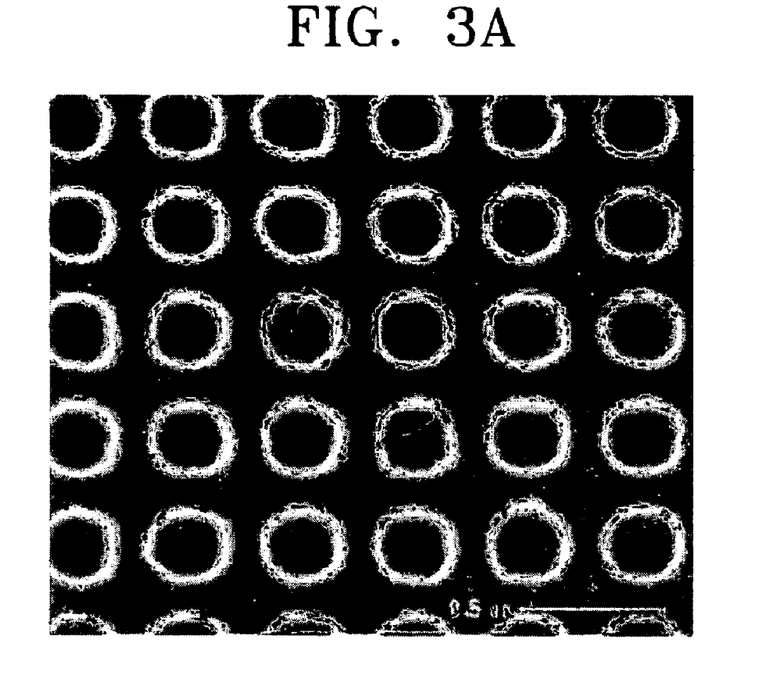
FIG. 3A is a photograph illustrating a black via caused by the hillocks when the copper interconnection is formed according to the conventional method.

As is clear from these photographs, the capping insulating layer is formed unevenly when the material constituting the capping insulating layer is deposited on a copper interconnection having hillocks. The uneven capping insulating layer may be vulnerable to dry etching. For example, when the etch process is carried out to form a via over the copper interconnection, a weak portion of the capping insulating layer is etched, which may allow the rinse solution or etch solution to penetrate the capping layer and oxidize the copper interconnection. In addition, the oxidized copper interconnection is dissolved and removed during a post rinsing process, which causes a black via phenomenon illustrated in FIG. 3A. Moreover, the hillocks are usually detected as defects only during an inspection that is carried out after the capping insulating layer is formed on the copper interconnection, and mask actual fatal defects. That is, the hillocks impede the ability of inspections associated with each subsequent fabrication process to accurately detect defects.

Figure 3B:
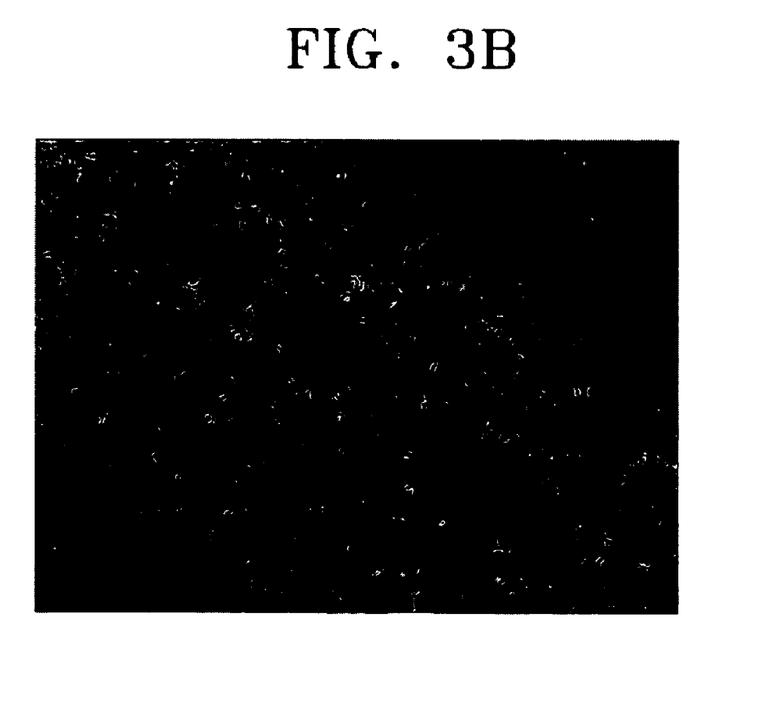
FIG. 3B is a photograph of hillocks in an inductor pattern when the copper interconnection is formed according to the conventional method.

Also, hillocks are more likely to be formed when the volume of the copper interconnection is large. In other words, hillocks occur more frequently the thicker the copper interconnection and the greater its surface area are. For instance, a dielectric layer of a metal-insulator-metal (MIM) capacitor formed over a copper interconnection may be broken by the hillocks because the MIM capacitor has a large surface area and hence, the copper interconnection must have a correspondingly large surface area and is thus likely to exhibit a great number of the hillocks. In this case, a large amount of leakage current occurs and the capacitor exhibits poor electrical properties. In the case of an inductor where the copper interconnection is 3 to 5 μm thick, the volume of the copper interconnection is thus relatively large. Accordingly, compressive stress is concentrated in the copper interconnection and the hillock problem is exacerbated, as illustrated in FIG. 3B.

Furthermore, in the conventional method, the grain size of the copper layer is very small, e.g. tens of nanometers, due to the characteristics of the electroplating process. Preferably the grain size of the copper layer is enlarged to reduce the resistivity of the copper interconnection. In particular, the copper layer 44 is annealed to enlarge the grain size. The annealing process is carried out at a temperature ranging from about 100° C. to 400° C. However, the large portion of the copper layer 44 disposed outside the opening 26 is over-stressed by the annealing process, causing the portion of the copper layer 44 located in the opening 26 to separate from the interlayer insulating layer 24. This occurs frequently when a fine damascene pattern is formed and the annealing process is carried out at the high end of the temperature range.

In view of this potential problem, the annealing of the copper is generally carried out at the low end of the temperature range, e.g. below 200° C. However, this limits the degree to which the copper grains can be grown. In particular, the grain growth cannot lower the resistivity enough especially in fine patterns, i.e., the conventional method can not realize devices based on small design rules.

SUMMARY OF THE INVENTION

An object of the present invention is to provide a highly reliable metal interconnection of a semiconductor device.

Another object of the present invention is to provide a fine metal interconnection of a semiconductor device that has low resistivity.

A more specific object of the present invention is to provide a method of manufacturing a metal interconnection of a semiconductor device that prevents hillocks from ultimately being produced at the surface of the metal interconnection, especially when a capping insulating layer is formed on an interlayer dielectric layer in which the metal interconnection is formed.

Another specific object of the present invention is to provide a method of making a fine metal interconnection of a semiconductor device in which the resistivity of the interconnection is reduced despite the small scale of the metal interconnection.

According to an aspect of the present invention, there is provided a method of forming a metal structure in which hillocks are intentionally produced at the surface of a metal layer and then are removed to prevent the hillocks from being able to reform at the surface of the metal layer. The metal layer is formed on a substrate. Then, a portion of the metal layer is removed using a chemical mechanical polishing (CMP) process to thereby form a planarized metal layer. Hillocks are formed at the planarized surface by treating the planarized metal layer with plasma. The upper surface of the planarized metal layer where the hillocks are formed is then removed using a CMP process and, preferably, the same CMP process used to initially planarize the metal layer.

According to another aspect of the present invention, there is provided a damascene process of forming a metal interconnection. To this end, an interlayer dielectric layer is formed on a semiconductor substrate. An opening is formed in the interlayer dielectric layer. A barrier layer is formed on inner walls of the interlayer dielectric layer that define the opening and on the upper surface of the interlayer dielectric layer. A metal layer is formed on the barrier layer and completes the filling of the opening. An upper portion of the metal layer is removed by a polishing process. Then the polished metal layer is treated with plasma. Next, the barrier layer is removed from the upper surface of the interlayer dielectric layer is removed to expose the upper surface of the interlayer dielectric layer around the opening. Finally, a capping insulating layer is formed on the upper surface of the portion of the metal layer that remains in the opening and on the upper surface of the interlayer dielectric layer.

According to another aspect of the present invention, there is provided a method of manufacturing a fine metal interconnection wherein the resistivity of the metal from which the interconnection is formed is reduced during the course of its manufacture. First, an interlayer dielectric layer on a semiconductor substrate. Then an opening is formed in the interlayer dielectric layer. The opening has a CD (critical dimension) on the order of micrometers or tens of micrometers. A barrier layer is formed on inner walls of the interlayer dielectric layer that define the opening and on an upper surface of the interlayer dielectric layer located around the opening. The metal layer, from which the interconnection is formed, is formed on the barrier layer to complete the filling of the opening. Next, an upper portion of the metal layer is removed by chemically mechanically polishing the metal layer. Then, grains of the metal layer are grown by treating the metal layer with plasma. Finally, an upper portion of the metal layer, in which the grains have been grown, is removed by chemically mechanically polishing the metal layer.

According to still another aspect of the present invention, there is provided a method of forming a metal interconnection of a semiconductor device wherein a plasma treatment is carried out during a stage of the process at which the plasma treatment can enhance the reliability and/or reduce the resistivity of the interconnection. First, an interlayer dielectric layer is formed on a semiconductor substrate, and an opening is formed in the interlayer dielectric layer. Then a metal layer is formed on the substrate to complete the filling of the opening. Next, the metal layer is planarized. Subsequently, the metal layer is treated with plasma. Finally, the metal layer is planarized again.

According to still another aspect of the present invention, there is provided a metal interconnection made by a process that will provide the metal interconnection with a surface that is substantially free of hillocks and/or that has a low resistivity as the result of enlarged grains.

In any of the aspects of the present invention summarized above, the metal layer may be formed of copper or a copper alloy. Also, and especially in the case of the metal layer being of copper or a copper alloy, the metal layer may be formed by electroplating the substrate. An annealing process may be carried out at a temperature in the range of 100° C. to 200° C. after the metal layer has been formed by electroplating to grow the grains to some extent without damaging the structure.

Also, the plasma treatment may be carried out in an ambient of $NH_3$, $N_2$, $H_2$, He or mixtures thereof. In addition, the plasma treatment may be carried out at 300° C. to 450° C. for 5 seconds to 60 seconds. Furthermore, the plasma treatment may be carried out at a temperature equal to or greater than that at which the capping insulating layer is formed. Still further, additional polishing and plasma treatment of the metal layer may be carried out between the time the metal layer is initially treated with plasma and the portion of the barrier layer is removed from the upper surface of the interlayer dielectric layer.

According to the method of forming the metal interconnection, the plasma treatment is carried out on the metal layer before the capping insulating layer is formed. Therefore, compressive stress is created in the metal layer and as a result, hillocks are produced at grain boundaries at the surface of the metal layer. In a fine pattern, e.g. a pattern having a CD on the order of micrometers or tens of micrometers, the plasma process also invites grain growth. A polishing process is carried out after the hillocks are produced and the grains of the metal layer are grown to make the surface of the metal layer smooth. Accordingly, the hillocks are not likely to reform during post production processes, such as when the capping insulating layer is formed. At the same time, the resistivity of the metal interconnection is reduced.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 4A:
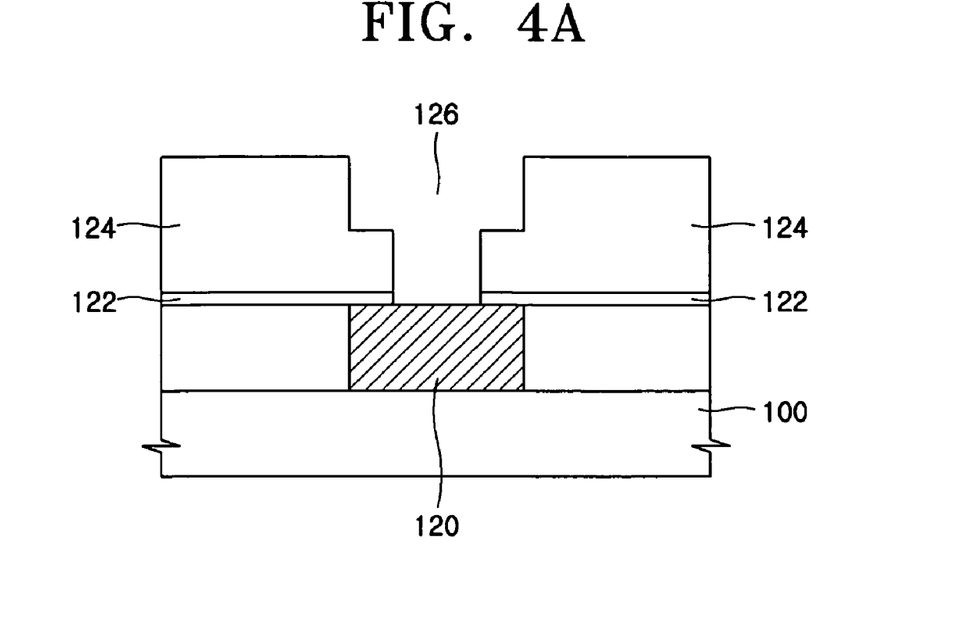
FIGS. 4A through 4H are cross-sectional views of a substrate illustrating a method of forming a metal interconnection of a semiconductor device according to the present invention.

Referring to FIG. 4A, an interlayer dielectric layer 124 is formed over a semiconductor substrate 100 on which a conductive layer 120, such as a conducive wiring layer, is situated. The interlayer dielectric layer 124 is etched to form an opening 126 therein. For example, the opening 126 may be a dual damascene type of opening that extends through the interlayer dielectric layer 124 and exposes a conductive element of the layer 120. In this case, an etch stop layer 122 may be formed on the conductive layer 120 to prevent the conductive element from being etched when the opening 126 is formed in the interlayer dielectric layer 124. Alternatively, the opening 126 may be in the form of a trench in the interlayer dielectric layer 124, i.e. a recess that does not extend through the interlayer dielectric layer 124.

Figure 4B:
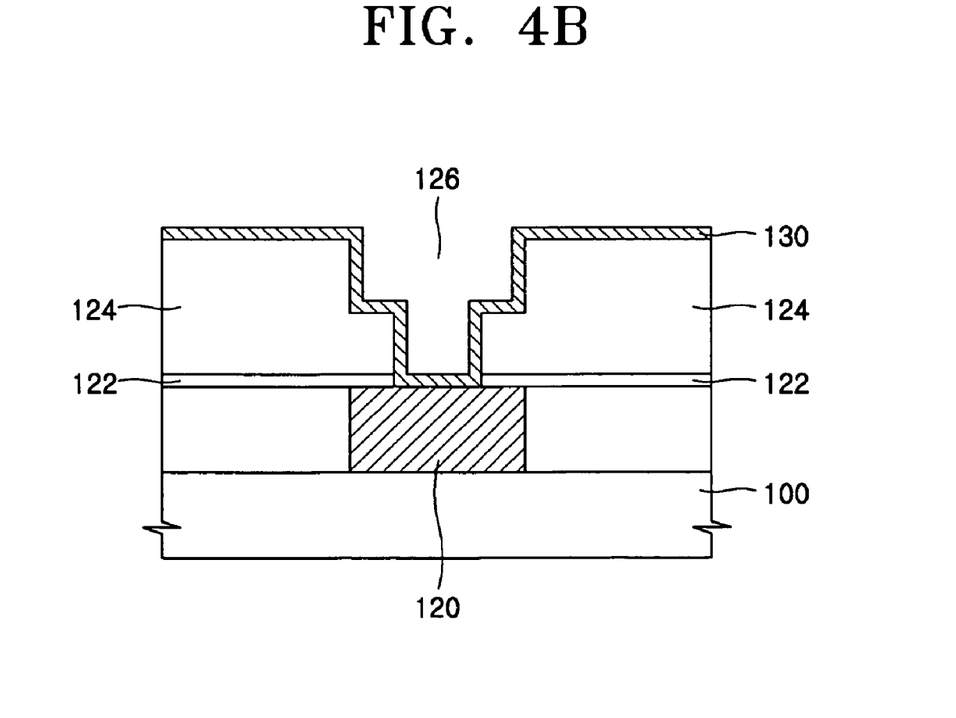

Referring to FIG. 4B, a conductive barrier layer 130 is formed on the upper surface of the interlayer dielectric layer 124 and on inner walls of interlayer dielectric layer 124 that define the opening 126. The conductive barrier layer 130 may be made, for example, of titanium (Ti), tantalum (Ta), tungsten (W), titanium nitride, tantalum nitride, tungsten nitride or a combination thereof.

Figure 4C:
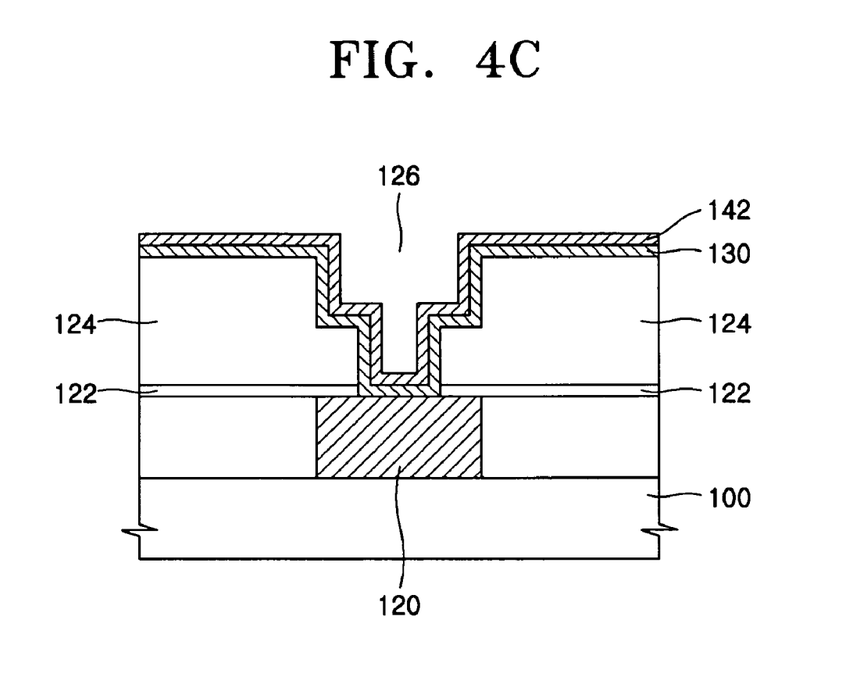

Referring to FIG. 4C, a metal seed layer 142 is formed on the conductive layer 130. For example, the metal seed layer 142 may be a copper seed layer when a copper interconnection or a copper alloy interconnection is to be formed.

Figure 4D:
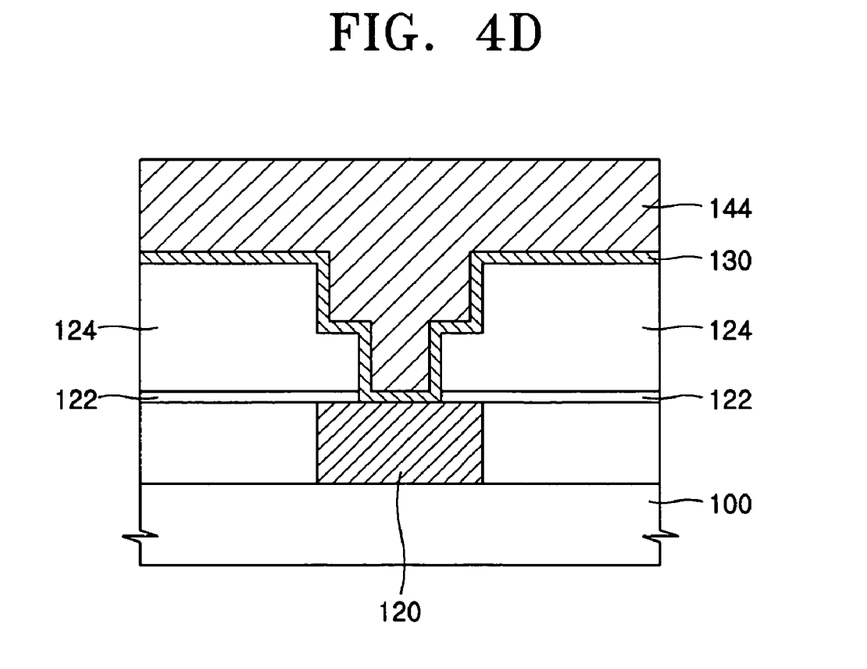

Referring to FIG. 4D, a metal layer 144 is formed on the metal seed layer 142 by carrying out an electroplating process using the metal seed layer 142. For example, the metal layer 144 may be a copper layer or a copper alloy layer. The metal layer 144 is formed thick enough to fill the opening 126.

An annealing process is then carried out to grow the grains of the metal layer 144. The annealing process may be carried out at a temperature in the range of about 100° C. to about 200° C.

Figure 4E:
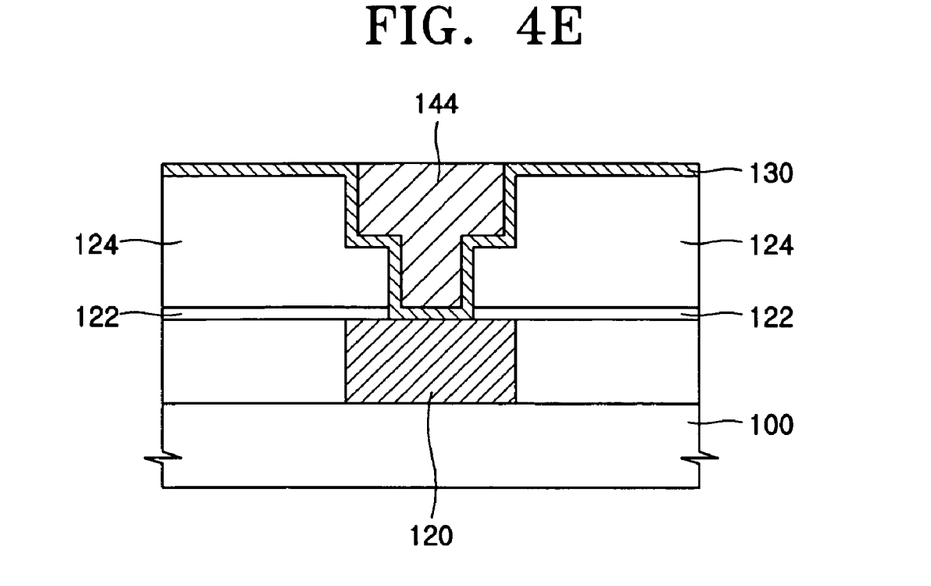

Referring to FIG. 4E, the portion of the metal layer 144 disposed outside the opening 126 is removed by a first chemical mechanical polishing (CMP) process so that the metal remains only within the opening 126. That is, only the conductive barrier layer 130 remains intact on the upper surface of the interlayer dielectric layer 124 after the first CMP process. However, if necessary, the first CMP process may be carried out until a portion of the metal layer 144 remains on the upper surface of the interlayer dielectric layer 124, i.e., the first CMP process may be terminated once the metal layer 144 has reached a predetermined thickness on the upper surface of the interlayer dielectric layer 124.

Figure 4F:
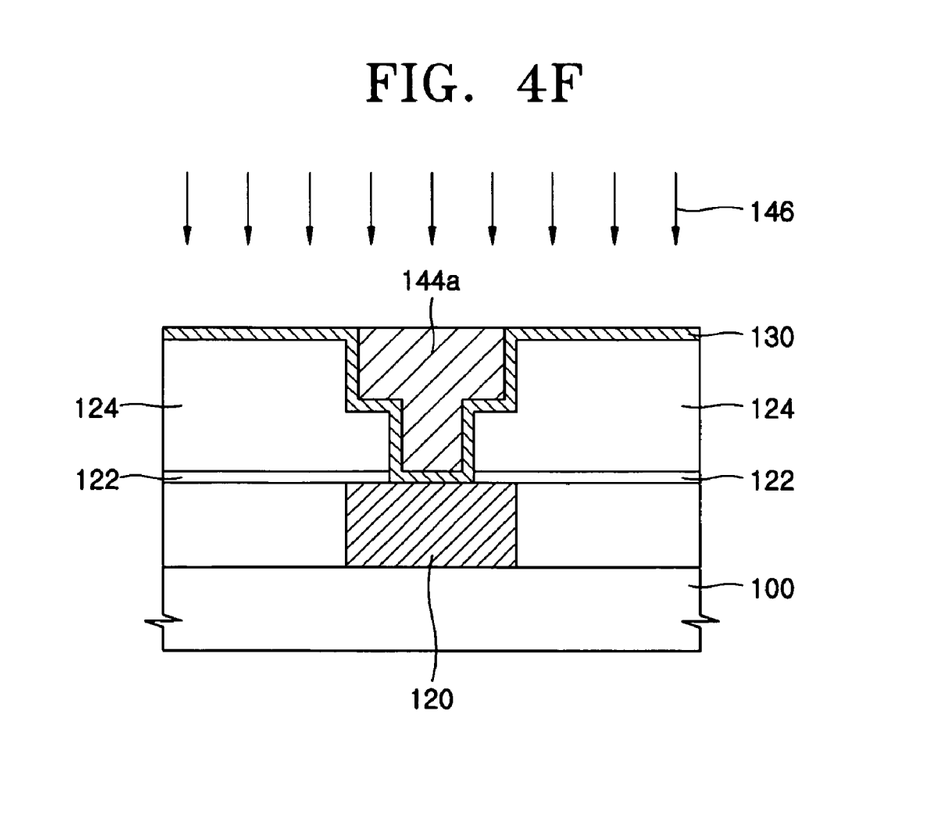

Referring to FIG. 4F, a plasma treatment process 146 is carried out over the resultant structure, thereby forming a plasma-treated metal layer 144a. At this time, the conductive barrier layer 130 is not removed from the upper surface of the interlayer dielectric layer 124. Also, hillocks are produced at some grain boundaries of the plasma-treated metal layer 144a due to compressive stress created by the plasma treatment process. As mentioned above, a portion of the metal layer 144 may be left over the portion of the barrier layer 130 extending along the upper surface of the interlayer dielectric layer 124. In this case, the plasma treatment process 146 is carried out on both the portion of the metal layer 144 disposed over the upper surface of the interlayer dielectric layer 124 and the portion of the metal layer 144 occupying the opening 126.

The plasma treatment process 146 may be carried out at a temperature ranging from about 300° C. to about 450° C. for about 5 seconds to 60 seconds in an ambient of $NH_3$, $N_2$, $H_2$, He or a combination thereof. Preferably, the process conditions of the plasma treatment process 146, such as the temperature and duration of the plasma treatment 146, have thresholds less than those of any other processes performed up until the time the capping insulating layer (150 in FIG. 4H) is formed. Otherwise, other hillocks may be produced in the plasma-treated metal layer 144a before the capping insulating layer is completed.

In any case, the grains of the metal layer 144 grow gradually during the plasma treatment process 146. As a result, the surface of the plasma-treated metal layer 144a becomes rough. Therefore, a supplementary CMP process may be carried out under the same conditions as the first CMP process illustrated in FIG. 4E to smoothen the upper surface of the plasma-treated metal layer 144a. In addition, a supplementary plasma treatment process may be carried out after the supplementary CMP process, and under the same conditions as the initial plasma treatment process 146. However, these processes are not essential.

Figure 4G:
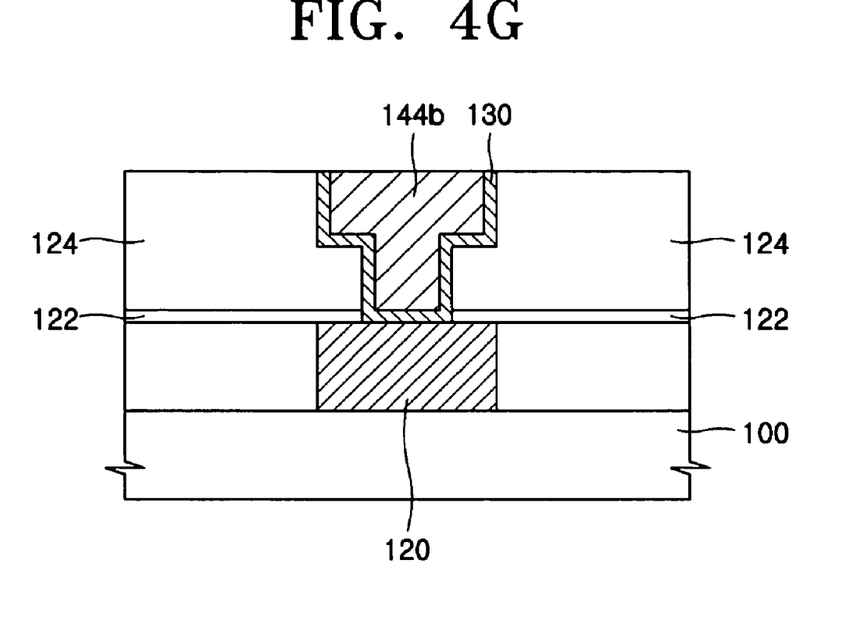

Rather, as illustrated in FIG. 4G, the rough surface of the plasma-treated metal layer 144a may be smoothened by a polishing process for removing the conductive barrier layer 130. In particular, a second CMP process is carried out for removing the conductive barrier layer 130 from the upper surface of the interlayer dielectric layer 124, whereupon the upper surface of the interlayer dielectric layer 124 around the opening 126 is exposed.

If necessary, a third CMP process is carried out to remove any residue of the conductive barrier layer 130 remaining on the upper surface of the interlayer dielectric layer 124. In this case, the third CMP process preferably uses a slurry having a high selectivity with respect to the interlayer dielectric layer 124. Finally, only a metal interconnection 144b remains within the opening 126.

Figure 4H:
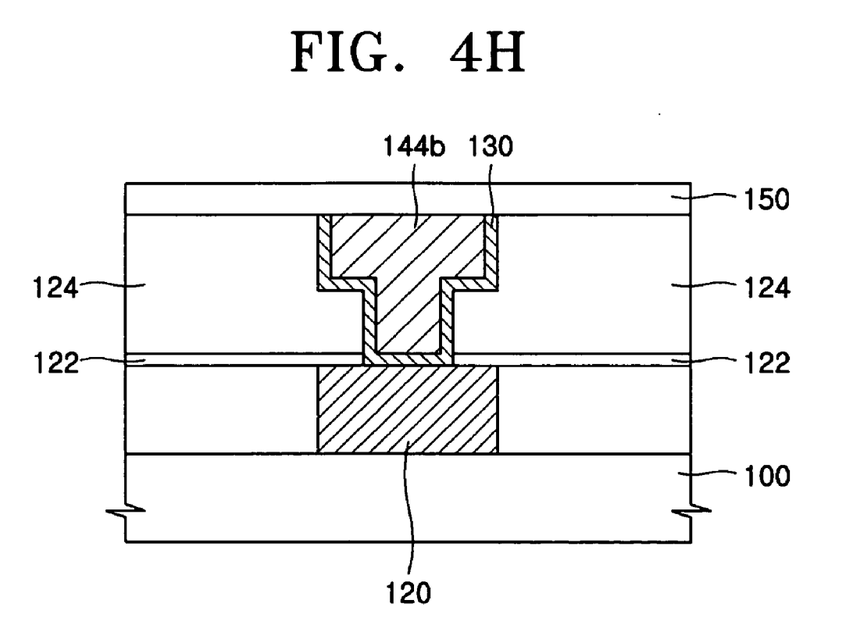

Referring to FIG. 4H, a capping insulating layer 150 is formed on the metal interconnection 144b and on the upper surface of the interlayer dielectric layer 124. The capping insulating layer 150 may be made of, for example, silicon nitride, SiCN, SiC or a combination thereof.

In addition, a plasma pre-treatment process may be performed on the surface of the metal interconnection 144b before the capping insulating layer 150 is formed to remove a metal oxide which may be formed when an exposed surface of the metal interconnection 144b contacts the atmosphere. The plasma pre-treatment process may comprise treating the oxidized surface of the metal interconnection 144b with plasma in an ambient of $NH_3$, $N_2$, $H_2$, He or a combination thereof. At this time, hillocks are not likely to be generated in the metal interconnection 144b because hillocks were already produced intentionally at weak portions of the metal layer 144 during the plasma treatment process 146 and then removed.

Figure 5A:
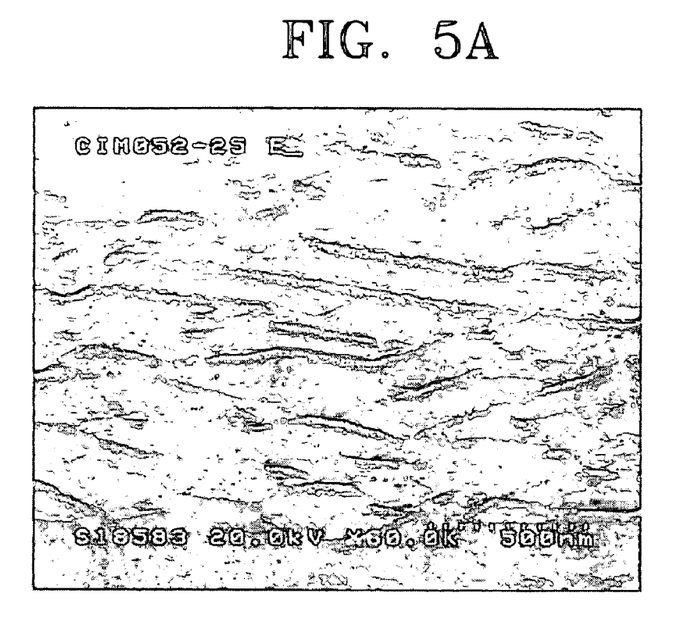
FIGS. 5A and 5B are photographs of the surface of a copper layer formed by electroplating, after the layer has been subjected to a first CMP process and has been treated with plasma according to the present invention.
Figure 5B:
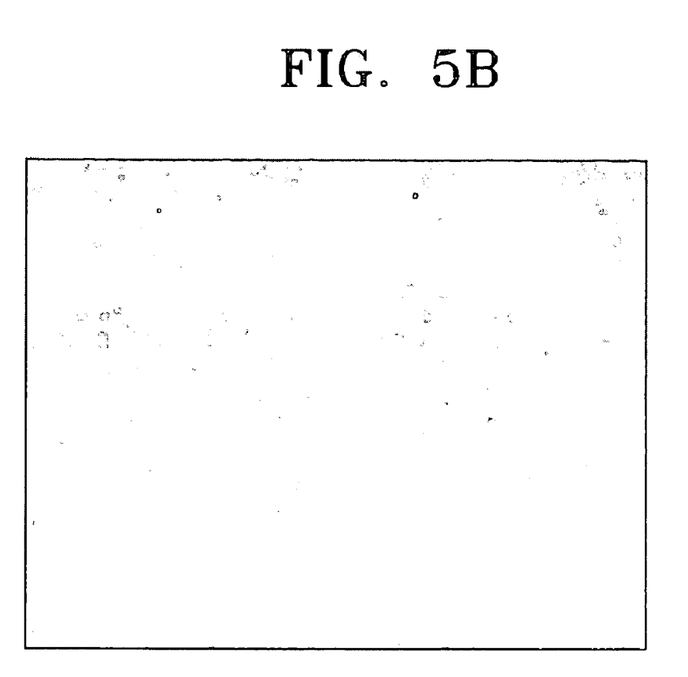

FIGS. 5A and 5B are photographs of the surface of a copper layer initially formed by an electroplating process, planarized using a first CMP process, and then treated with plasma at 400° C. in a $NH_3$ ambient according to the present invention. The photograph of FIG. 5A shows the growth of the copper grains due to the plasma treatment process, i.e., the increased surface roughness of the copper layer. The photograph of FIG. 5B shows the copper hillocks produced by the plasma treatment process.

Figure 6:
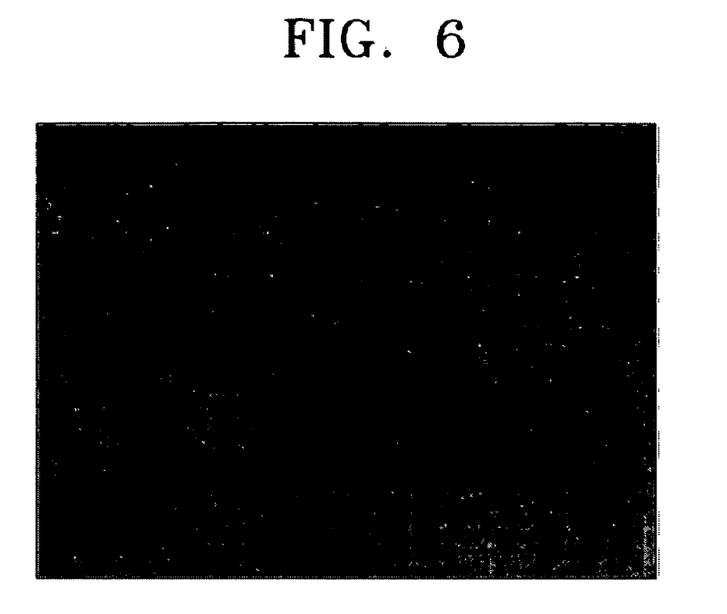
FIG. 6 is a photograph of the surface of a capping insulating layer formed over a copper interconnection, illustrating the relative lack of surface defects when the copper interconnection is formed according to the method of the present invention.

FIG. 6 is a photograph of the surface of the resultant structure after the second CMP process was carried out on the plasma-treated copper layer to remove the hillocks, and the capping insulating layer was formed. Comparing this photograph with the photograph of FIG. 2A, it is clear that a metal interconnection made according to the present invention has fewer surface defects than a metal interconnection made according to the conventional process.

Figure 7:
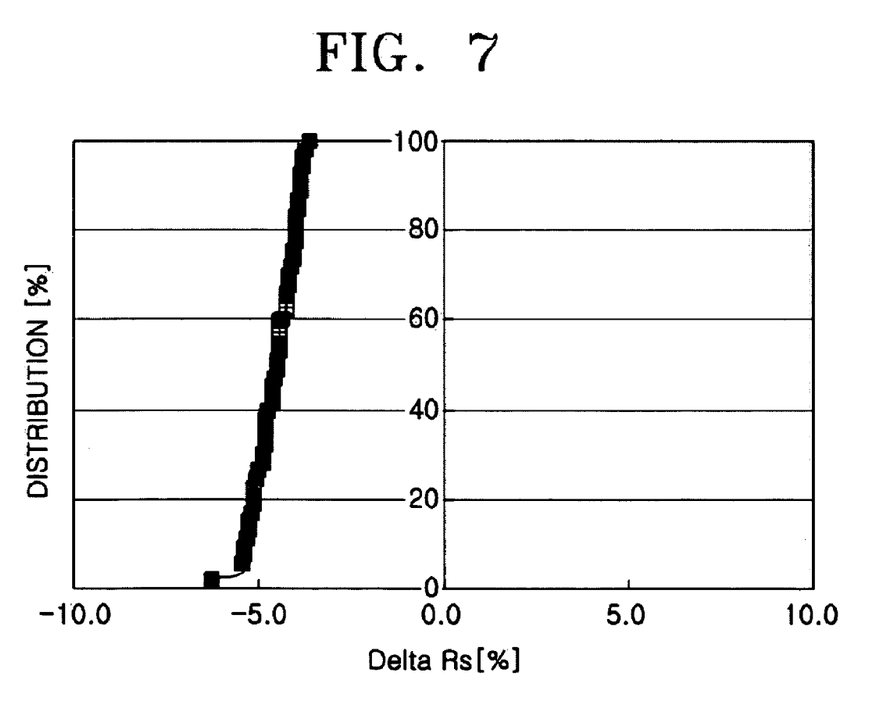
FIG. 7 is a graph illustrating the decreased resistivity of the copper layer after the layer has been treated with plasma according to the present invention.

FIG. 7 is a graph illustrating the decreased resistivity of the copper layer after the plasma treatment process is carried out in a method of forming a copper interconnection according to the present invention. In order to obtain the results plotted in the graph of FIG. 7, a wafer was coated with a copper layer and then annealed at 100° C. Subsequently, the copper layer was polished by a CMP process and the resistivity of the copper layer was measured in a trench having a CD (critical dimension) of 0.12 μm. Afterwards, a plasma treatment was carried out at 400° C. in an $NH_3$ ambient and the resistivity of the copper layer was measured again. Therefore, the values that are referred to in the graph of FIG. 7 as Delta Rs are the decrements of the resistivity, i.e., the difference between the first and second measurements. FIG. 7 shows that the resistivity is decreased to about 5% by virtue of the plasma treatment process.

The method of forming a metal interconnection according to the present invention includes treating a metal layer with plasma between a first CMP process and a second CMP process, wherein the first CMP process is carried out to polish the metal layer and the second CMP process is carried out to complete the formation of a metal interconnection from the metal layer by, for example, removing portions of a barrier metal layer. The plasma treatment process grows the grains of the metal layer to thereby lower the resistivity of the metal layer. The plasma treatment process also creates compressive stress in the metal layer and thus, also has the effect of producing hillocks on the metal layer. The hillocks and the increased surface roughness of the metal layer are removed by the second CMP process so that the surface of the metal interconnection is smooth. Furthermore, additional hillocks are not likely to form when the capping insulating layer is formed because of the previous creation and removal of hillocks from portions of the metal layer that are most susceptible to their formation. In addition, the grains of the metal layer are grown by the plasma treatment process and yet the ultimate metal interconnection has a smooth surface. Accordingly, the present invention provides a metal interconnection having enhanced reliability and capable of transmitting signals at a high rate.

Finally, although the present invention has been particularly shown and described with reference to the preferred embodiments thereof, various changes in form and detail may be made to the preferred embodiments without departing from the true spirit and scope of the present invention as defined by the following claims.

What is claimed is:

1. A method of forming structure of a semiconductor device, comprising:
   forming a metal layer on a substrate;
   chemically mechanically polishing the metal layer to thereby form a planarized metal layer;
   treating the planarized metal layer with plasma to form hillocks at the upper surface of the planarized metal layer; and
   subsequently chemically mechanically polishing the metal layer to remove the hillocks.

2. The method of claim 1, wherein the forming of the metal layer comprises forming a layer of copper or of a copper alloy on the substrate.

3. The method of claim 1, wherein the forming of the metal layer comprises electroplating the substrate.

4. The method of claim 3, further comprising annealing the metal layer at a temperature of 100° C. to 200° C. before the planarized metal layer is treated with the plasma.

5. The method of claim 4, wherein the annealing is carried out in an ambient of $N_2$ or $H_2$.

6. The method of claim 1, wherein the treating of the planarized metal layer with plasma is carried out in an ambient of gas selected from the group consisting of $NH_3$, $N_2$, $H_2$, He, and mixtures thereof.

7. The method of claim 1, wherein the treating of the planarized metal layer with plasma is carried out at 300° C. to 450° C.

8. The method of claim 1, wherein the planarized metal layer is treated with the plasma for a time period in the range of 5 seconds to 60 seconds.

9. The method of claim 1, further comprising forming a capping insulating layer on the metal layer from which the hillocks have been removed.

10. The method of claim 9, further comprising treating the metal layer with plasma, after the metal layer has been chemically mechanically polished to remove the hillocks therefrom and before the capping insulating layer is formed, to remove an oxidized portion of the metal layer.

11. The method of claim 9, wherein the treating of the planarized metal layer with plasma is carried out at a temperature equal to or greater than that at which the capping insulating layer is formed.

12. A method of forming structure of a semiconductor device having a metal interconnection, comprising:
   forming an interlayer dielectric layer on a semiconductor substrate;
   forming an opening in the interlayer dielectric layer;
   forming a barrier layer on inner walls of the interlayer dielectric layer that define the opening and on an upper surface of the interlayer dielectric layer located around the opening;
   forming a metal layer on the barrier layer that completes the filling of the opening;
   removing an upper portion of the metal layer;
   subsequently treating the metal layer with plasma to form hillocks at the upper surface of the metal layer;
   subsequently removing the barrier layer from the upper surface of the interlayer dielectric layer to expose the upper surface of the interlayer dielectric layer around the opening; and
   subsequently forming a capping insulating layer on the upper surface of the metal layer in the opening and on the upper surface of the interlayer dielectric layer.

13. The method of claim 12, wherein the forming of the metal layer comprises forming a layer of copper or a copper alloy on the barrier layer that completes the filling of the opening.

14. The method of claim 12, wherein the forming of the metal layer comprises:
   forming a metal seed layer on the barrier layer; and
   subsequently carrying out an electroplating process to thereby form the metal layer on the metal seed layer.

15. The method of claim 14, further comprising annealing the metal layer at 100° C. to 200° C.

16. The method of claim 15, wherein the annealing is carried out in an $N_2$ ambient or an H2 ambient.

17. The method of claim 12, wherein the treating of the metal layer with plasma is carried out in an ambient of gas selected from the group consisting of $NH_3$, $N_2$, $H_2$, He, and mixtures thereof.

18. The method of claim 12, wherein the treating of the metal layer with plasma is carried out at 300° C. to 450° C.

19. The method of claim 12, wherein the metal layer is treated with the plasma for a time period in the range of 5 seconds to 60 seconds.

20. The method of claim 12, wherein the treating of the metal layer with plasma is carried out at a temperature equal to or greater than that at which the capping insulating layer is formed.

21. The method of claim 12, further comprising:
   polishing the surface of the metal layer after the metal layer has been treated with the plasma; and
   subsequently treating the surface of the metal layer with plasma again before the barrier layer is removed from the upper surface of the interlayer dielectric layer.

22. The method of claim 21, wherein the treating of the metal layer with plasma subsequent to the polishing of the surface of the metal layer is carried out in an ambient of gas selected from the group consisting of $NH_3$, $N_2$, $H_2$, He, and mixtures thereof.

23. The method of claim 21, wherein the treating of the metal layer with plasma subsequent to the polishing of the surface of the metal layer is carried out at 300° C. to 450° C.

24. The method of claim 12, wherein the treating of the metal layer with plasma is carried out while the metal layer and the barrier layer are both exposed.

25. The method of claim 12, wherein the forming of the barrier layer comprises forming a layer of material selected from the group consisting of titanium (Ti), tantalum (Ta), tungsten (W), titanium nitride, tantalum nitride, tungsten nitride, and combinations thereof, on inner walls of the interlayer dielectric layer that define the opening and on an upper surface of the interlayer dielectric layer located around the opening.

26. A method of forming structure of a semiconductor device having a metal interconnection, comprising:
   forming an interlayer dielectric layer on a semiconductor substrate;
   forming an opening in the interlayer dielectric layer having a CD (critical dimension) on the order of micrometers or tens of micrometers;
   forming a barrier layer on inner walls of the interlayer dielectric layer that define the opening and on an upper surface of the interlayer dielectric layer located around the opening;
   forming a metal layer on the barrier layer, that completes the filling of the opening;
   removing an upper portion of the metal layer by chemically mechanically polishing the metal layer;
   growing grains in the chemically mechanically polished metal layer by treating the metal layer with plasma; and
   subsequently removing an upper portion of the metal layer in which the grains have been grown, by chemically mechanically polishing the metal layer.

27. The method of claim 26, wherein the forming of the metal layer comprises forming a layer of copper or a copper alloy on the barrier layer, that completes the filling of the opening.

28. The method of claim 27, further comprising annealing the metal layer at 100° C. to 200° C. before the metal layer is treated with the plasma.

29. The method of claim 28, wherein the annealing is carried out in an $N_2$ ambient or an $H_2$ ambient.

30. The method of claim 26, wherein the forming of the metal layer comprises electroplating the substrate.

31. The method of claim 26, wherein the treating of the metal layer with plasma is carried out in an ambient of gas selected from the group consisting of $NH_3$, $N_2$, $H_2$, He, and mixtures thereof.

32. The method of claim 26, wherein the treating of the metal layer with plasma is carried out at 300° C. to 450° C.

33. The method of claim 26, wherein the treating of the metal layer with plasma is carried out for a time period in the range of 5 seconds to 60 seconds.

34. The method of claim 26, further comprising subsequently forming a capping insulating layer on the metal layer.

35. The method of claim 34, further comprising treating the metal layer with plasma, after the upper portion of the metal layer in which the grains have been grown has been removed and before the capping insulating layer is formed, to remove an oxidized portion of the metal layer.

36. The method of claim 34, wherein the treating of the metal layer with plasma is carried out at a temperature equal to or greater than that at which the capping insulating layer is formed.

37. A method of forming structure of a semiconductor device having a metal interconnection, comprising:
   forming an interlayer dielectric layer on a semiconductor substrate;
   forming an opening in the interlayer dielectric layer;

forming a metal layer on the substrate that completes the filling of the opening;

planarizing the metal layer;

subsequently treating the planarized metal layer with plasma to form hillocks at the upper surface of the planarized metal layer; and subsequently planarizing the metal layer again.

38. The method of claim 37, wherein the forming of the metal layer comprises forming a layer of copper or a copper alloy on the barrier layer, that completes the filling of the opening, and the planarizing of the metal layer before and after the metal layer is treated with plasma is carried out by chemically mechanically polishing the metal layer.

39. The method of claim 38, wherein the forming of the layer of copper or a copper alloy comprises an electroplating process.

40. The method of claim 39, further comprising annealing the layer of copper or a copper alloy at 100° C. to 200° C. before the layer is treated with plasma.

* * * * *